(12) United States Patent
Hiraoka et al.

(10) Patent No.: US 12,225,659 B2
(45) Date of Patent: Feb. 11, 2025

(54) ELECTRONIC CONTROL DEVICE

(71) Applicant: Hitachi Astemo, Ltd., Hitachinaka (JP)

(72) Inventors: Miki Hiraoka, Tokyo (JP); Yoshio Kawai, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 330 days.

(21) Appl. No.: 17/797,000

(22) PCT Filed: Dec. 25, 2020

(86) PCT No.: PCT/JP2020/048668
§ 371 (c)(1),
(2) Date: Aug. 2, 2022

(87) PCT Pub. No.: WO2021/166447
PCT Pub. Date: Aug. 26, 2021

(65) Prior Publication Data
US 2023/0054252 A1 Feb. 23, 2023

(30) Foreign Application Priority Data
Feb. 17, 2020 (JP) .................................. 2020-024134

(51) Int. Cl.
*H05K 1/00* (2006.01)
*H05K 1/02* (2006.01)
*H05K 7/20* (2006.01)

(52) U.S. Cl.
CPC .......... *H05K 1/0224* (2013.01); *H05K 1/0206* (2013.01); *H05K 7/2039* (2013.01); *H05K 7/205* (2013.01); *H05K 2201/066* (2013.01)

(58) Field of Classification Search
CPC .. H05K 1/0224; H05K 1/0206; H05K 7/2039; H05K 7/205; H05K 2201/066
(Continued)

(56) References Cited

U.S. PATENT DOCUMENTS

| 2011/0176280 A1* | 7/2011 | Lee | ................... | H01L 23/49816 361/721 |
| 2015/0245464 A1* | 8/2015 | Kuganesan | ............. | H01L 23/36 361/717 |
| 2015/0319880 A1* | 11/2015 | Strickland | ............ | H05K 1/0209 29/890.035 |

FOREIGN PATENT DOCUMENTS

| JP | 2005-191378 A | 7/2005 |
| JP | 2008-130684 A | 6/2008 |

(Continued)

OTHER PUBLICATIONS

International Search Report with English Translation and Written Opinion dated Mar. 16, 2021.

*Primary Examiner* — Zhengfu J Feng
(74) *Attorney, Agent, or Firm* — Volpe Koenig

(57) ABSTRACT

An electronic control device includes a board including a heat sink on which a heat generation element is mounted, and a housing that is in contact with the board and dissipates heat of the heat generation element to the outside. A potential of the housing is a ground, and a potential of the heat sink is a non-ground. The board includes a first layer including a first non-ground wiring that is in direct contact with the heat sink, and a second layer including a second ground wiring that is in electrical and thermal contact with the housing. The first non-ground wiring and the second ground wiring overlap each other in plan view from a thickness direction of the board.

3 Claims, 14 Drawing Sheets

(58) Field of Classification Search
USPC .......................................................... 361/709
See application file for complete search history.

(56) References Cited

FOREIGN PATENT DOCUMENTS

| | | | | |
|---|---|---|---|---|
| JP | 2013089718 A | * | 5/2013 | ............. H01L 23/36 |
| JP | 2014-036033 A | | 2/2014 | |
| JP | 2019-075511 A | | 5/2019 | |
| WO | WO-2017208802 A1 | * | 12/2017 | ............. H01L 23/12 |

* cited by examiner

ELECTRONIC CONTROL DEVICE

TECHNICAL FIELD

The present invention relates to an electronic control device.

BACKGROUND ART

In recent years, the number of electronic control devices mounted on automobiles tends to increase with electrification and high functionality of automobiles. An electronic control device is required to be reduced in size and weight due to an increasing need for global warming countermeasures and improvement in layout flexibility. It is required to improve the heat dissipation property of the electronic control device due to an increase in the heat generation density of an electronic component with size reduction and a use of resin for a housing material with weight reduction. In particular, in an electronic component used in a circuit configuration in which a heat sink on which a heat generation element is mounted is not dropped to GND, it is necessary to provide a wiring structure that electrically insulates the heat sink from a GND wiring formed on a wiring board, and it is required to improve the heat dissipation property.

A configuration in which heat generated in an electronic control device is finally dissipated to the surface of the electronic control device, that is, to the outside from a housing, is generally provided. When the potentials of the housing and a heat dissipation portion are not equal to each other, it is necessary to devise heat transfer. For example, PTL 1 discloses an electronic circuit device including: a heat generating electronic element having a heat dissipating electrode; a multilayer board having a surface on which the heat generating electronic element is mounted; and a housing to which the multilayer board is accommodated and fixed. The electronic circuit device includes a surface heat transfer conductor and an inner-layer-side heat transfer conductor. The surface heat transfer conductor is provided on the surface of the multilayer board, and the heat dissipating electrode is soldered to the surface heat transfer conductor. The inner-layer-side heat transfer conductor is formed in an inner layer of the multilayer board to overlap the surface heat transfer conductor in a thickness direction of the multilayer board. The heat transfer electrode has a positive potential, the inner-layer-side heat transfer conductor has a ground potential. The inner-layer-side heat transfer conductor is connected to the housing to be capable of heat conduction.

CITATION LIST

Patent Literature

PTL 1: JP 2008-130684 A

SUMMARY OF INVENTION

Technical Problem

In the invention in PTL 1, the mounting area of the board is reduced.

Solution to Problem

According to a first aspect of the present invention, an electronic control device includes a board including a heat sink on which a heat generation element is mounted, and a housing that is in contact with the board and dissipates heat of the heat generation element to the outside. A potential of the housing is a ground, and a potential of the heat sink is a non-ground. The board includes a first layer including a first non-ground wiring that is in direct contact with the heat sink, and a second layer including a second ground wiring that is in electrical and thermal contact with the housing. The first non-ground wiring and the second ground wiring overlap each other in plan view from a thickness direction of the board.

Advantageous Effects of Invention

According to the present invention, it is possible to improve the heat dissipation property for an electronic component in which the potential of the heat sink is non-ground, without reducing the mounting area. Objects, configurations, and advantageous effects other than those described above will be clarified by the descriptions of the following embodiments.

DESCRIPTION OF EMBODIMENTS

Figure 1:
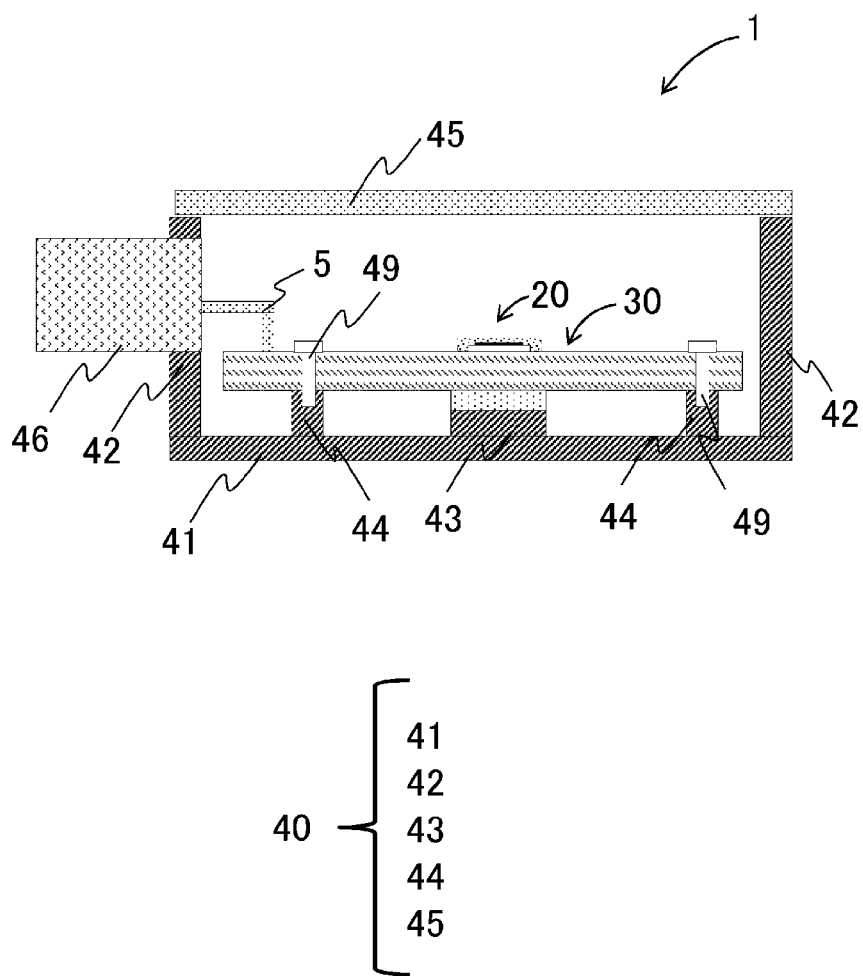
FIG. 1 is a cross-sectional view of an electronic control device.

Hereinafter, embodiments of the present invention will be described with reference to the drawings. Examples are for describing the present invention, and are omitted and simplified as appropriate for clarity of description. The present invention can be implemented in various other forms. Unless otherwise specified, each component may be singular or plural. Positions, sizes, shapes, ranges, and the like of the components illustrated in the drawings may not represent actual positions, sizes, shapes, ranges, and the like in order to facilitate understanding of the invention. Therefore, the present invention is not necessarily limited to the positions, sizes, shapes, ranges, and the like illustrated in the drawings.

First Embodiment

An electronic control device according to a first embodiment will be described below with reference to FIGS. 1 to 9. The ratio of dimensions is not uniform in the drawings, and the scale is not constant even in the same drawing.

FIG. 1 is a cross-sectional view of an electronic control device 1. The electronic control device 1 includes an electronic component 20, a board 30, a connector 46, and a housing 40. In the configuration of the electronic control device 1, a component that generates a large amount of heat is the electronic component 20. Heat generated by the electronic component 20 is transferred to the housing 40 as described later, and is cooled mainly on the surface of the housing 40, that is, the outer peripheral surface in FIG. 1.

The housing 40 has a substantially rectangular parallelepiped shape, and includes a housing bottom portion 41 corresponding to a bottom of the rectangular parallelepiped, a housing side surface 42 corresponding to a side surface of the rectangular parallelepiped, and a housing upper portion 45 corresponding to a ceiling of the rectangular parallelepiped. The housing 40 further includes two housing supports 44 protruding upward from the housing bottom portion 41, and a housing protrusion 43 that is provided substantially at the center of the housing bottom portion 41 and protrudes upward. The connector 46 and the board 30 are connected by a terminal 5. The housing support 44 fixes the board 30 together with a board fixing member 49. An insulating heat transfer portion 60 which is an insulator is disposed between the housing protrusion 43 and the board 30.

Polybutylene terephthalate (PBT), polyphenylene sulfide (PPS), or the like is used as a material of the housing 40. As a material of the insulating heat transfer portion 60, an adhesive, a sheet, or the like formed of a binder such as silicone resin, urethane resin, or epoxy resin and a filler such as ceramics, metal, or metal oxide is used.

Figure 2:
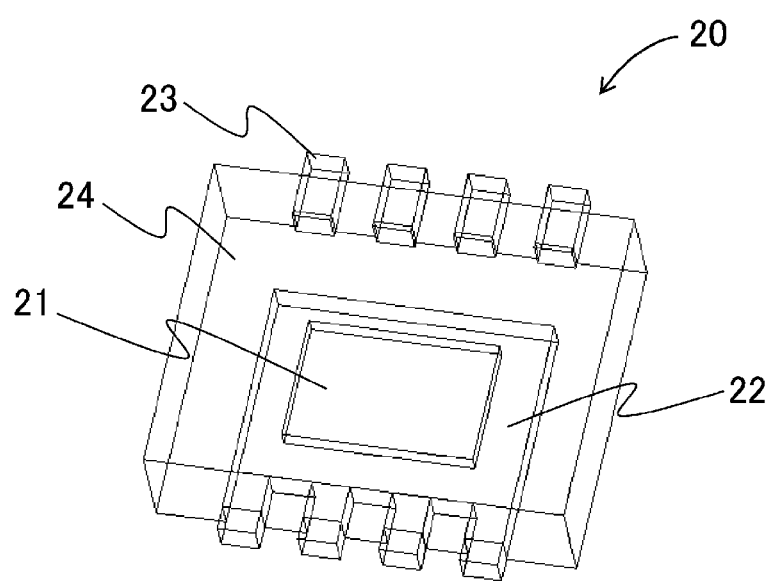
FIG. 2 is a configuration diagram of an electronic component.

FIG. 2 is a configuration diagram of the electronic component 20. The electronic component 20 includes a heat generation element 21, a heat sink 22 on which the heat generation element 21 is mounted, and a terminal 23. The heat generation element 21, the heat sink 22, and the terminal 23 are integrally sealed with sealing resin 24. In FIG. 2, in order to clearly illustrate the configuration, the inside of the sealing resin 24 is illustrated in a manner of be seen through. Among the components of the electronic component 20, the heat generation element 21 generates the largest amount of heat. In the present embodiment, a configuration for transferring heat generated by the heat generation element 21 to the housing 40 will be mainly described.

Figure 3:
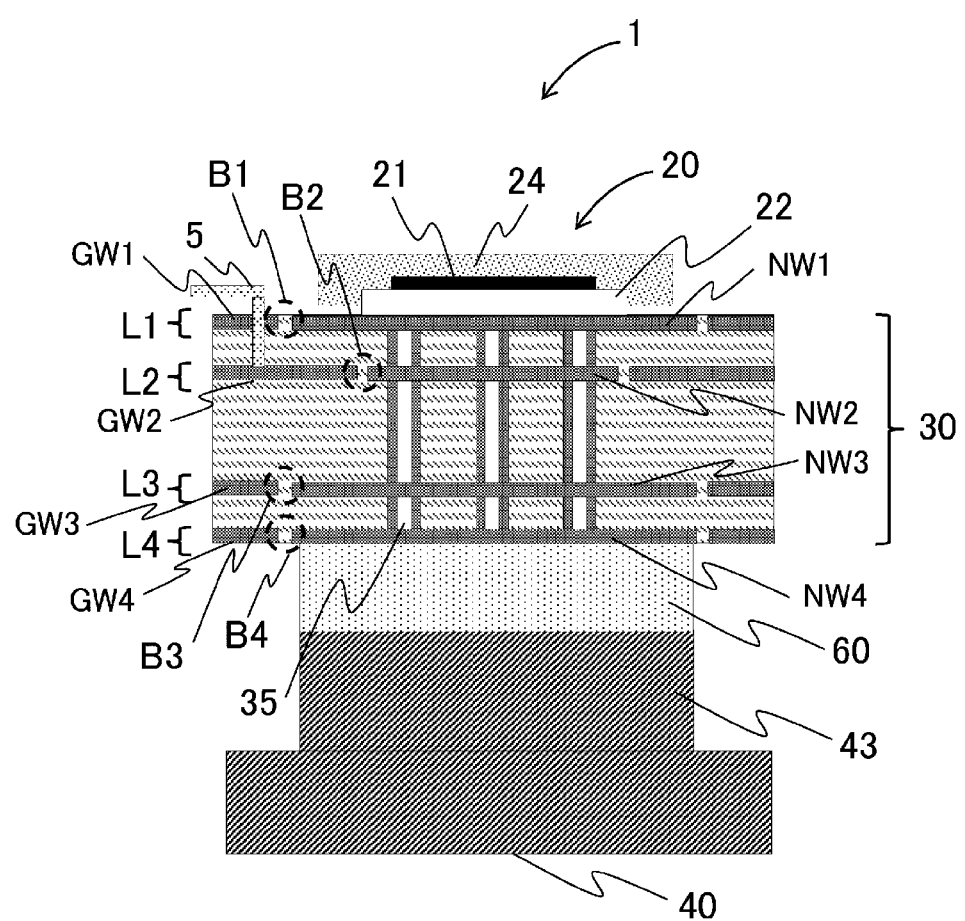
FIG. 3 is an enlarged cross-sectional view of a vicinity of the electronic component according to a first embodiment.

FIG. 3 is a cross-sectional view of the electronic control device 1, and is an enlarged view illustrating the vicinity of the electronic component 20. The heat generation element 21 is, for example, a MOSFET or a diode. The heat generation element 21 generates the largest amount of heat among the components built in the electronic control device 1.

The heat sink 22 is thermally connected to the heat generation element 21 and transfers heat from the heat generation element 21 to the board 30. The heat sink 22 is also electrically connected to the heat generation element 21, and both have a non-ground potential. The heat sink 22 is electrically and thermally connected to the board 30 by, for example, lead-free solder such as Sn—Ag—Cu or a conductive material (not illustrated) such as an Ag paste. The terminal 23 is connected to a wiring formed on the board 30 by a conductive material (not illustrated).

The board 30 includes a first layer L1, a second layer L2, a third layer L3, and a fourth layer L4. For example, the board 30 is formed to have a desired thickness by bonding a prepreg to a core material. The first layer L1 to the fourth layer L4 are arranged in order in a thickness direction of the board 30, that is, a vertical direction in the drawing. The first layer L1 is a surface of the board 30 on the upper side in the drawing, and the fourth layer L4 is a surface of the board 30 on the lower side in the drawing. The second layer L2 and the third layer L3 are provided in the board 30. Each layer includes a ground wiring having a ground potential and a non-ground wiring having a non-ground potential.

The ground wiring included in the first layer L1 is referred to as a first ground wiring GW1, and the non-ground wiring included in the first layer L1 is referred to as a first non-ground wiring NW1. The ground wiring included in the second layer L2 is referred to as a second ground wiring GW2, and the non-ground wiring included in the second layer L2 is referred to as a second non-ground wiring NW2. The ground wiring included in the third layer L3 is referred to as a third ground wiring GW3, and the non-ground wiring included in the third layer L3 is referred to as a third non-ground wiring NW3. The ground wiring included in the fourth layer L4 is referred to as a fourth ground wiring GW4, and the non-ground wiring included in the fourth layer L4 is referred to as a fourth non-ground wiring NW4.

A boundary between the first ground wiring GW1 and the first non-ground wiring NW1 of the first layer L1 is referred to as a first boundary B1. A boundary between the second ground wiring GW2 and the second non-ground wiring NW2 of the second layer L2 is referred to as a second boundary B2. A boundary between the third ground wiring GW3 and the third non-ground wiring NW3 of the third layer L3 is referred to as a third boundary B3. A boundary between the fourth ground wiring GW4 and the fourth non-ground wiring NW4 of the fourth layer L4 is referred to as a fourth boundary B4. The first boundary B1 and the second boundary B2 do not overlap each other in plan view from the thickness direction. The third boundary B3 and the fourth boundary B4 overlap each other in plan view from the thickness direction. The first boundary B1 and the third boundary B3 may or may not overlap each other in plan view from the thickness direction.

The board 30 includes one or a plurality of vias 35 penetrating the board 30 in the thickness direction. Although three vias 35 are illustrated in FIG. 3, the number of vias 35 is not limited. The via 35 is formed by forming a through hole in the board 30 by a drill or the like, and performing plating with copper or the like on the inner peripheral surface of the through hole. The via 35 is directly connected to the first non-ground wiring NW1, the second non-ground wiring NW2, the third non-ground wiring NW3, and the fourth non-ground wiring NW4, and is electrically and thermally connected thereto.

The first non-ground wiring NW1 included in the first layer L1 is electrically and thermally connected to the heat sink 22 by the above-described conductive material (not illustrated). The first ground wiring GW1 included in the first layer L1 and the second ground wiring GW2 included in the second layer L2 are electrically and thermally connected to the housing side surface 42 by the terminal 5. Therefore, the terminal 5 may also be referred to as a heat transfer portion.

As illustrated in FIG. 3, forming is performed so that the first non-ground wiring NW1 and the second ground wiring GW2 overlap each other in plan view from the thickness direction of the board 30, and the second boundary B2 overlaps the first non-ground wiring NW1 in plan view from the thickness direction of the board 30. Thus, even when the heat sink 22 of the electronic component 20 is electrically insulated from the second ground wiring GW2 of the board 30, the heat generated by the heat generation element 21 is transferred to the second ground wiring GW2 without reducing the mounting area, and thus the heat dissipation property is improved. In FIG. 3, the housing 40 includes the housing protrusion 43 in order to avoid interference with other electronic components mounted on the fourth layer L4 side, but the configuration in which the housing 40 includes the housing protrusion 43 is not essential.

(Heat Dissipation Path)

Figure 4:
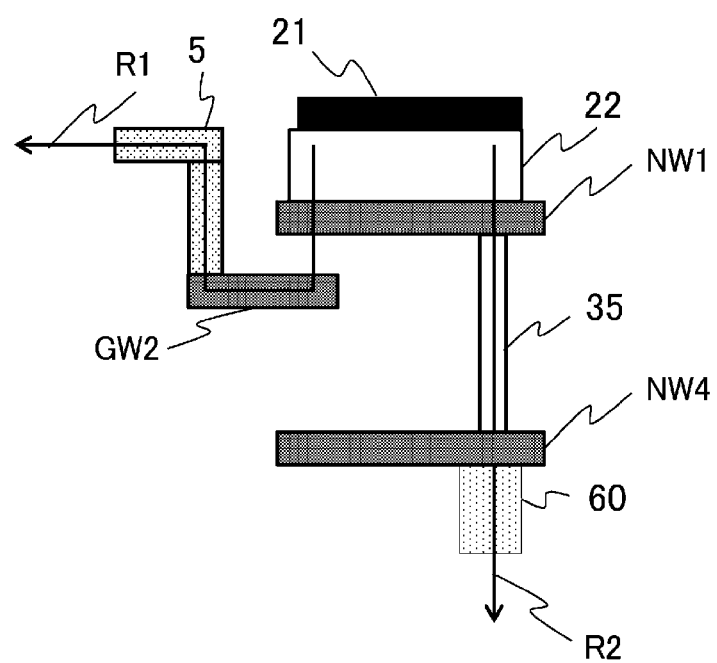
FIG. 4 is a conceptual diagram illustrating a heat dissipation path of the electronic control device in the first embodiment.

FIG. 4 is a conceptual diagram illustrating a heat dissipation path of the electronic control device 1. FIG. 4 illustrates only portions necessary for describing the heat dissipation path in FIG. 3. Heat emitted by the heat generation element 21 is transferred to the housing 40 through a first heat path R1 and a second heat path R2. The first heat path R1 is a path reaching the housing 40 via the heat sink 22, the first non-ground wiring NW1, the core material of the board 30, the second ground wiring GW2, and the terminal 5. The second heat path R2 is a path reaching the housing 40 via the heat sink 22, the first non-ground wiring NW1, the via 35, the fourth non-ground wiring NW4, and the insulating heat transfer portion 60.

(Parameter)

Figure 5:
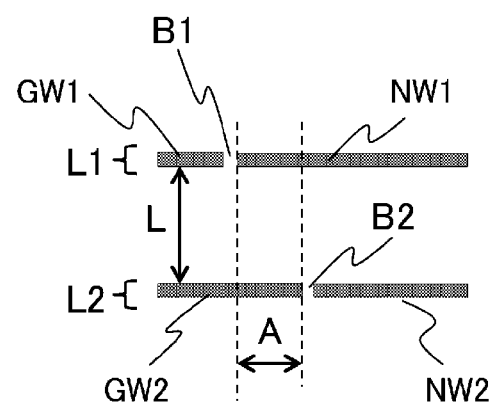
FIG. 5 is a diagram for explaining parameters in the electronic control device.

FIG. 5 is a diagram for explaining parameters in the electronic control device 1. Although the electronic control device 1 has many parameters that are design values in design, representative parameters in the present embodiment will be described with reference to FIG. 5. A gap between the first layer L1 and the second layer L2, more specifically, a gap between the first non-ground wiring NW1 and the second non-ground wiring NW2 is referred to as a distance L. An area in which the first non-ground wiring NW1 and the second ground wiring GW2 overlap each other in plan view from the thickness direction of the board 30 is referred to as an area A.

(Configuration of Comparative Example)

Figure 6:
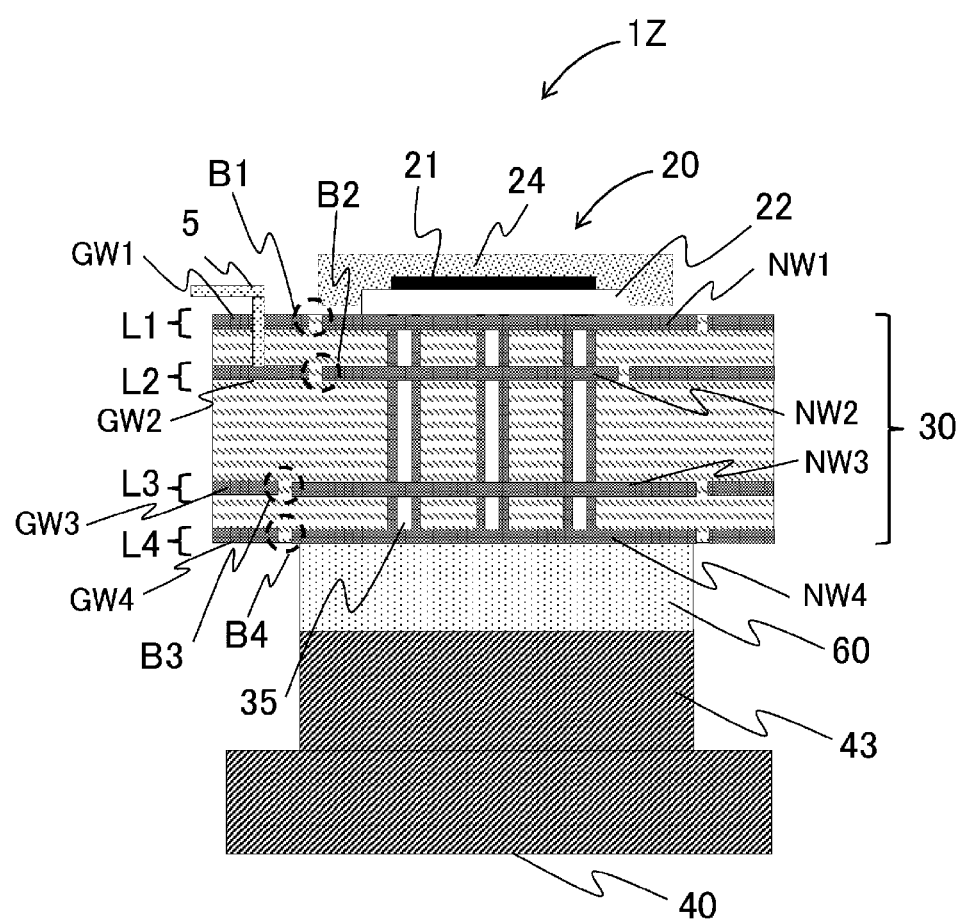
FIG. 6 is a cross-sectional view of a comparative device.

FIG. 6 is a cross-sectional view of a comparative device 1Z as a comparative example of the electronic control device 1. The comparative device 1Z has the similar configuration to the electronic control device 1 except for a configuration described below. In the comparative device 1Z, the first ground wiring GW1 faces the second ground wiring GW2 face each other, and the first non-ground wiring NW1 faces the second non-ground wiring NW2. The first non-ground wiring NW1 and the second ground wiring GW2 do not face each other. Therefore, in the comparative device 1Z, the above-described first heat path R1 does not exist.

(Calculation Conditions and Calculation Results)

Comparison of simulation calculations between the electronic control device 1 in the present embodiment and the comparative device 1Z as the comparative example will be described.

In the electronic control device 1, a MOSFET is used for the electronic component 20, and lead-free solder made of Sn-3Ag-0.5Cu was used for a conductive material 50. The area of the heat sink 22 was 1.6 mm×2.2 mm, and the area of the sealing resin 24 was 1.3 mm×22 mm. As the board 30, a printed wiring board having a square of 70 mm, a thickness of 1.6 mm, and four-layer wiring was used. The areas of the first non-ground wiring NW1 and the fourth non-ground wiring NW4 were set to 36 mm2, the area of the second non-ground wiring NW2 was set to 4.6 mm2, and the second boundary B2 was set to 0.1 mm.

In the comparative device 1Z, the area of the second non-ground wiring NW2 was set to 36 mm2, and the first boundary B1 and the second boundary B2 overlapped each other in plan view from the thickness direction of the board 30. It is assumed that other configurations were the same as those of the electronic control device 1. The above descriptions are specific calculation conditions in the simulations of the electronic control device 1 and the comparative device 1Z. A result obtained by performing simulation using the calculation conditions will be described with reference to FIGS. 7 to 9.

Figure 7:
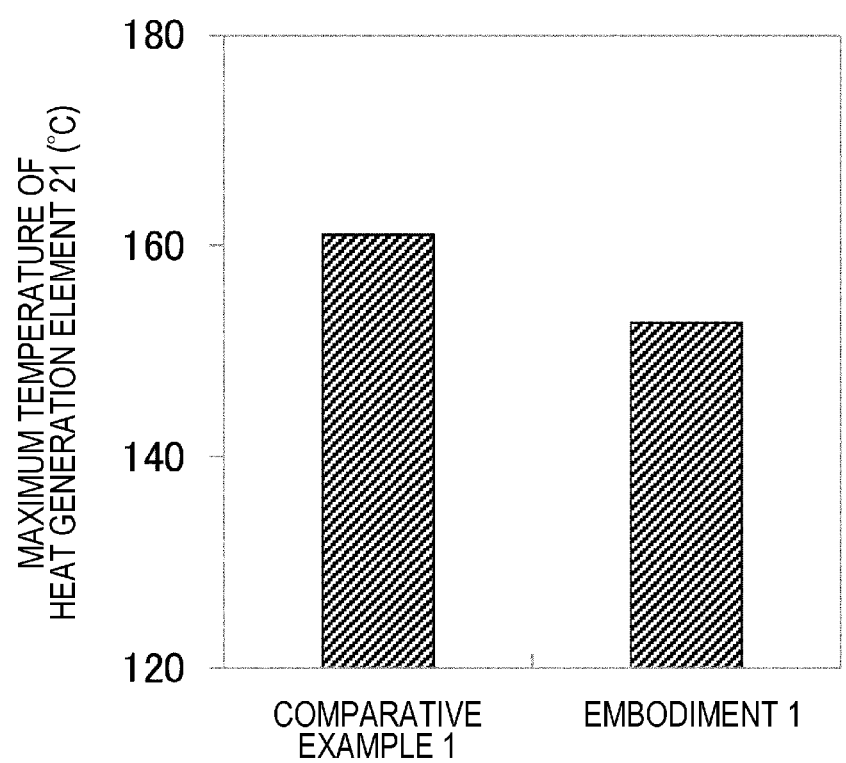
FIG. 7 is a diagram illustrating comparison between maximum temperatures of heat generation elements.

FIG. 7 is a diagram illustrating comparison between the maximum temperatures of the heat generation elements 21. For the electronic control device 1 and the comparative device 1Z, the maximum temperatures of the heat generation elements 21 when the heat generation elements 21 were generated by 1 W were compared with each other. As measurement conditions, the electronic control device 1 and the comparative device 1Z were placed in a wind tunnel in which air at 105° C. was in a windless state (wind speed: 0 m/s), and the maximum temperature of the heat generation element 21 was measured.

As illustrated in FIG. 7, the maximum temperature of the heat generation element 21 in the electronic control device 1 is lower than the maximum temperature of the heat generation element 21 in the comparative device 1Z by about 13%. Thus, it can be seen that the electronic control device 1 is capable of suppressing the temperature rise of the heat generation element 21 much than the comparative device 1Z and higher heat dissipation. In the electronic control device 1, the first non-ground wiring NW1 and the second ground wiring GW2 overlap each other in plan view from the thickness direction of the board 30, and a region between the second ground wiring GW2 and the second non-ground wiring NW2 overlaps in plan view from the thickness direction of the board 30. Therefore, it is possible to waste the heat of the heat generation element 21 from the terminal 5 to the housing 40 via the second ground wiring GW2. As a result, as illustrated in FIG. 7, it is possible to suppress the temperature rise of the heat generation element 21.

Figure 8:
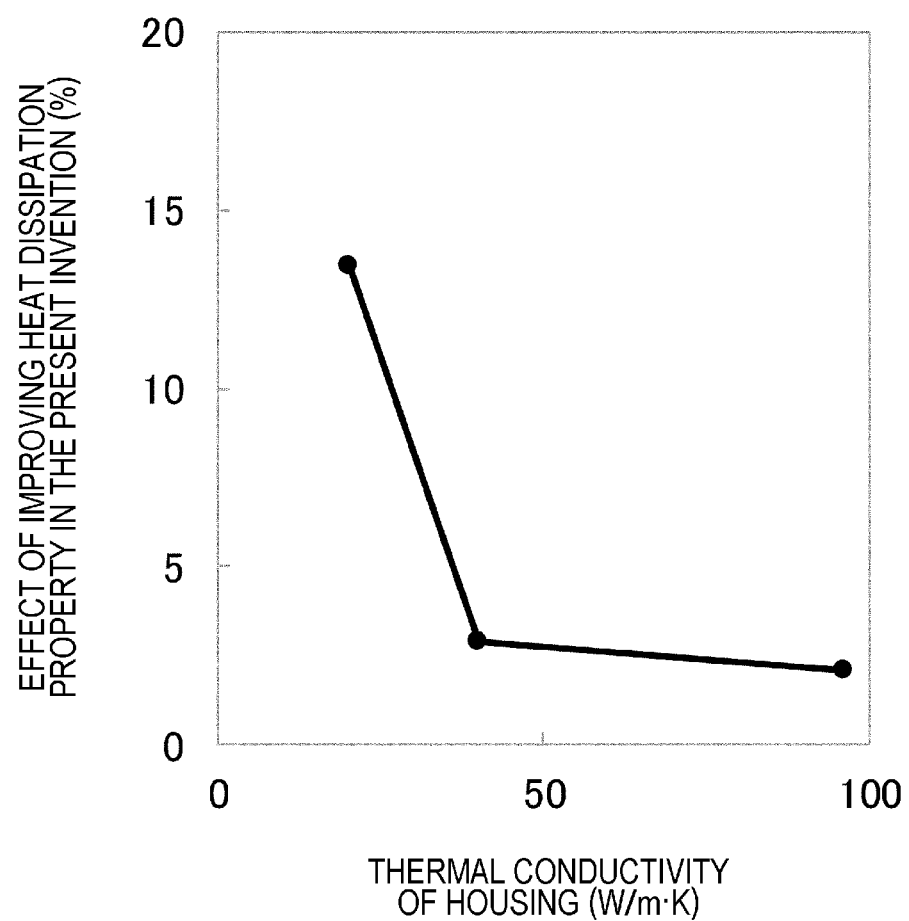
FIG. 8 is a diagram illustrating a heat dissipation improvement rate of the electronic control device with respect to thermal conductivity of a housing.

FIG. 8 is a diagram illustrating a heat dissipation improvement rate of the electronic control device 1 with respect to the thermal conductivity of the housing 40. The heat dissipation improvement rate is a ratio of the maximum temperature of the heat generation element 21 in the electronic control device 1 in the first embodiment to the maximum temperature of the heat generation element 21 in the comparative device 1Z. For example, when the maximum temperature of the comparative device 1Z is 110 degrees and the maximum temperature of the electronic control device 1 is 100 degrees, the heat dissipation improvement rate is 10%. As illustrated in FIG. 8, when the thermal conductivity of the housing 40 is equal to or less than 40 W/m K, an effect of improving the heat dissipation is high, which is preferable. The thermal conductivity of the resin is very low, and is 10 to 20 W/m·K or less in the most cases even when a filler is contained. Therefore, the result illustrated in FIG. 8 shows that the effect is high when the housing 40 is made of resin.

Figure 9:
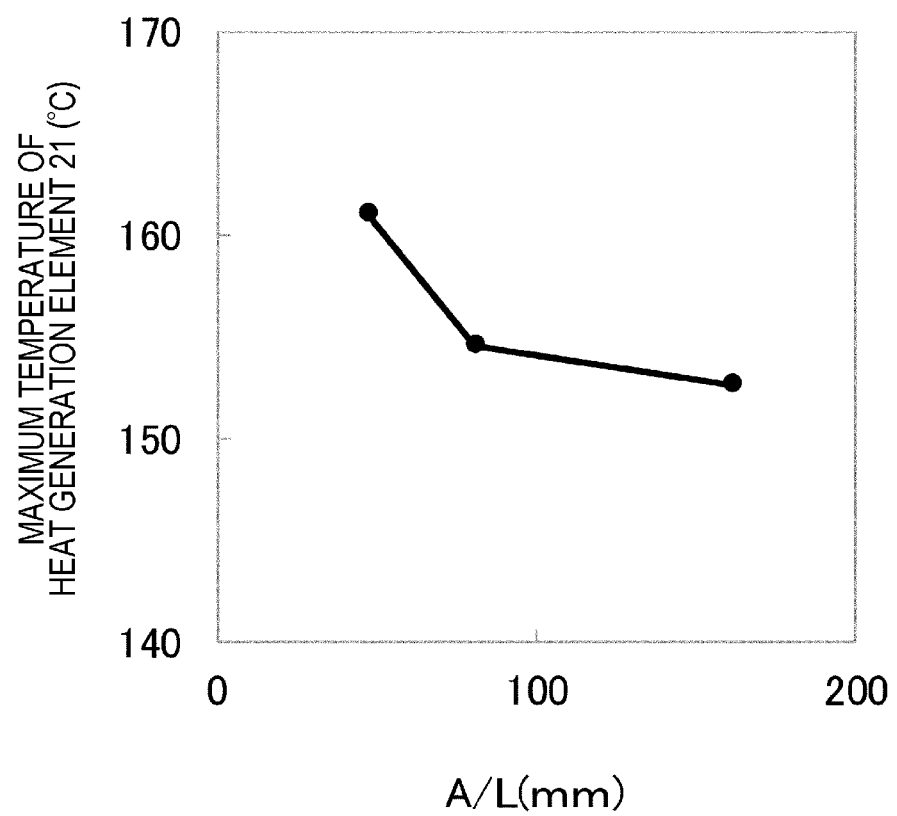
FIG. 9 is a diagram illustrating a relation between a ratio of an area A to a distance L and the maximum temperature of the heat generation element.

FIG. 9 is a diagram illustrating a relation between the two parameters described with reference to FIG. 5, that is, the ratio between the distance L and the area A, and the maximum temperature of the heat generation element 21. As illustrated in FIG. 9, when the ratio of the area A to the distance L is equal to or greater than 80 mm, the maximum temperature of the heat generation element 21 is greatly decreased, which is preferable.

According to the first embodiment described above, it is possible to obtain the following operational effects.

(1) The electronic control device 1 includes the board 30 including the heat sink 22 on which the heat generation element 21 is mounted, and the housing 40 that is in contact with the board 30 and dissipates heat of the heat generation element 21 to the outside. The potential of the housing 40 is ground, and the potential of the heat sink 22 is non-ground. The board 30 includes the first layer L1 including the first non-ground wiring NW1 that is in direct contact with the heat sink 22 and the second layer L2 including the second ground wiring GW2 that is in electrical and thermal contact with the housing 40. The first non-ground wiring NW1 and the second ground wiring GW2 overlap each other in plan view from the thickness direction of the board 30. Therefore, it is possible to dissipate heat through the first heat path R1, and to improve the heat dissipation property for the electronic control device 1 in which the potential of the heat sink 22 is non-ground, without reducing the effective mounting area.

(2) The board 30 includes the via 35 penetrating the board 30 in the thickness direction. The via 35 of the board 30 is in thermal contact with the housing 40 via the insulating heat transfer portion 60 which is an insulator. Therefore, it is possible to more actively transfer the heat of the heat generation element 21 to the housing 40 by using the via 35.

(3) The housing 40 is made of resin. Therefore, as illustrated in FIG. 8, the effect of improving the heat dissipation property, which is obtained in a manner that, as described above, the first non-ground wiring NW1 and the second ground wiring GW2 overlap each other in plan view from the thickness direction of the board 30 is high.

(4) It is desirable that the ratio of the area A in which the first non-ground wiring NW1 and the second ground wiring GW2 overlap with each other in plan view with respect to the distance L between the first non-ground wiring NW1 and the second ground wiring GW2 in the thickness direction of the board 30 be greater than 80 mm. With such a configuration, the effect of suppressing the maximum temperature of the heat generation element 21 is high as illustrated in FIG. 9.

Modification Example 1

The board 30 may not include the third layer L3 and the fourth layer L4. The board 30 may not include the via 35. The board 30 may not include the third layer L3, the fourth layer L4, and the via 35.

Figure 10:
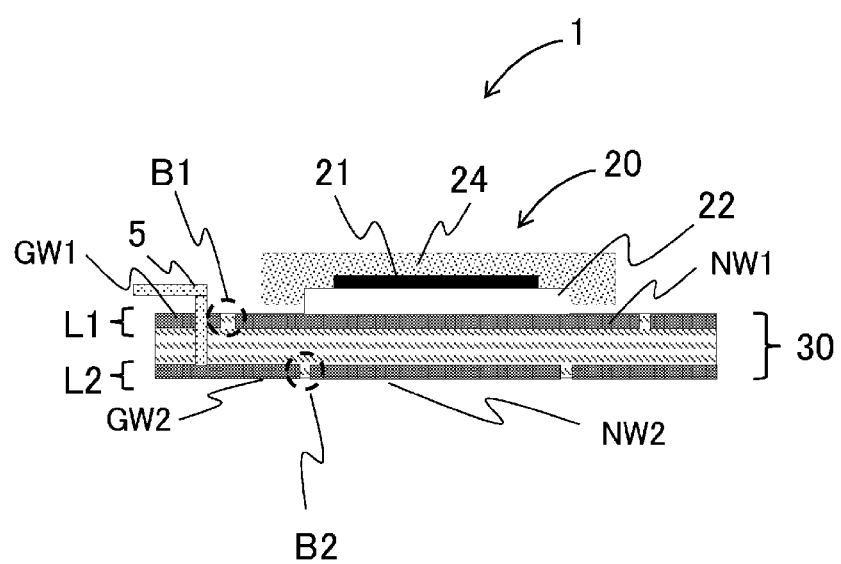
FIG. 10 is a cross-sectional view of an electronic control device in Modification Example 1.

FIG. 10 is a cross-sectional view of an electronic control device 1 in Modification Example 1. FIG. 10 corresponds to FIG. 3 in the first embodiment. The electronic control device 1 in the present modification example includes only the first layer L1 and the second layer L2. In the present modification example, the board 30 has only the first heat path R1.

Modification Example 2

In FIG. 3 in the first embodiment, the board 30 has a bilaterally symmetrical shape. The board 30 may not be bilaterally symmetrical. For example, the first non-ground wiring NW1 and the second ground wiring GW2 may overlap each other in plan view from the thickness direction of the board 30 only on the left side in the drawing, and the first boundary B1 and the second boundary B2 may overlap each other in plan view from the thickness direction of the board 30 on the right side in the drawing.

Modification Example 3

The housing 40 may not include the housing upper portion 45. In addition, the terminal 5 may be connected to the housing bottom portion 41 instead of the housing side surface 42, and in this case, the housing 40 may not include the housing side surface 42.

Modification Example 4

The board fixing member 49 may electrically and thermally connect the second ground wiring GW2 and the housing support 44. In this case, the terminal 5 may not electrically and thermally connect the second ground wiring GW2 and the housing support 44. That is, the second ground wiring GW2 and the housing support 44 may be electrically and thermally connected to each other by at least one of the terminal 5 and the board fixing member 49.

Second Embodiment

An electronic control device according to a second embodiment will be described below with reference to FIGS. 11 and 12. In the following description, the same components as those of the first embodiment are denoted by the same reference signs, and differences will be mainly described. The points not specifically described are the same as those in the first embodiment. The present embodiment is different from the first embodiment mainly in that the third boundary B3 and the fourth boundary B4 do not overlap in plan view from the thickness direction.

Figure 11:
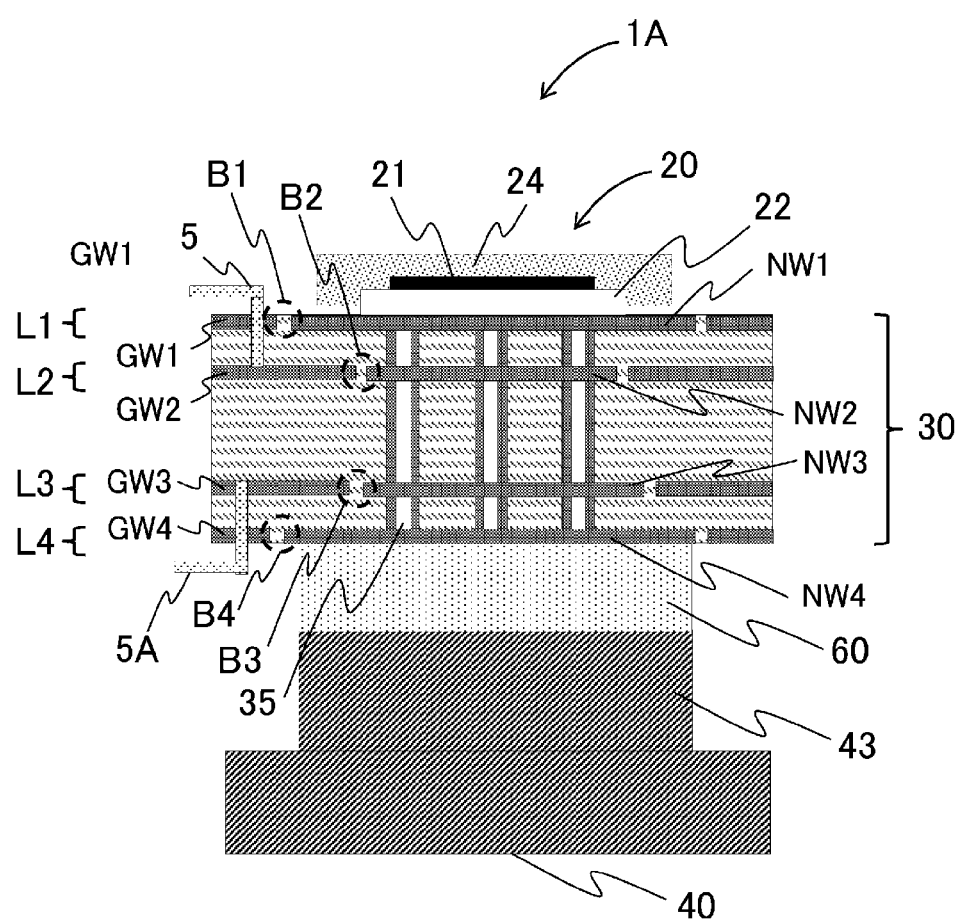
FIG. 11 is an enlarged cross-sectional view of a vicinity of an electronic component according to a second embodiment.

FIG. 11 is a cross-sectional view of the vicinity of the electronic component 20 in an electronic control device 1A according to the second embodiment. FIG. 11 corresponds to FIG. 3 in the first embodiment. The electronic control device 1A further includes a second terminal 5A in addition to the configuration of the board 30 in the first embodiment. The second terminal 5A electrically and thermally connects the third ground wiring GW3 and the housing side surface 42. The second terminal 5A may also be connected to the fourth ground wiring GW4. The second terminal 5A is electrically and thermally connected to the housing side surface 42 at a left end in FIG. 11. In the present embodiment, the third boundary B3 is closer to the via 35 than the fourth boundary B4, and the third ground wiring GW3 and the fourth non-ground wiring NW4 overlap each other in plan view from the thickness direction of the board 30.

(Heat Dissipation Path)

Figure 12:
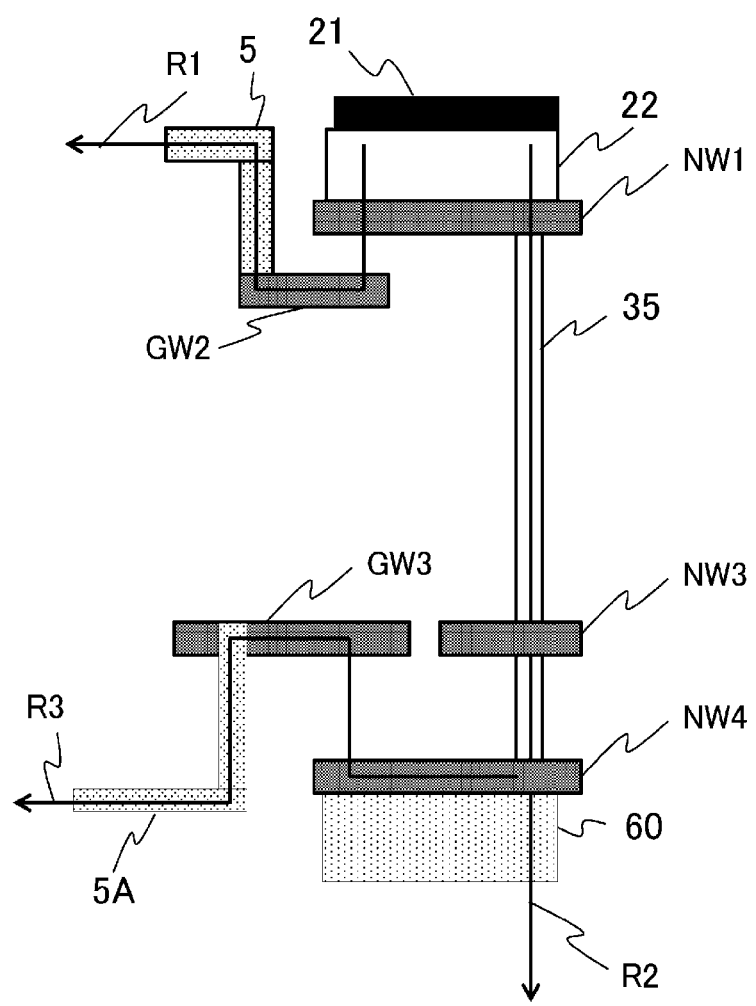
FIG. 12 is a conceptual diagram illustrating a heat dissipation path of an electronic control device in the second embodiment.

FIG. 12 is a conceptual diagram illustrating a heat dissipation path of the electronic control device 1A. FIG. 12 illustrates only portions necessary for describing the heat dissipation path in FIG. 11. The electronic control device 1A further includes a third heat path R3 in addition to the first heat path R1 and the second heat path R2 similar to those in the first embodiment. The third heat path R3 is a path through which the heat transferred to the fourth non-ground wiring NW4 via the via 35 is moved to the third ground wiring GW3 via the core material of the board 30 and further transferred to the housing side surface 42 via the second terminal 5A.

According to the second embodiment described above, it is possible to obtain the following operational effects.

(5) The first layer L1 is provided on one surface of the board 30. The second layer L2 is a layer closest to the first layer L1 in the board. The board 30 includes the fourth layer L4 on the other surface of the board 30. The board 30 includes the third layer L3 which is an inner layer closest to the fourth layer L4. The third layer L3 includes the third ground wiring GW3 that is not in direct contact with the via 35 but is in electrical and thermal contact with the housing 40. The fourth layer L4 includes the fourth non-ground wiring NW4 that is in direct contact with the via 35. The fourth non-ground wiring NW4 and the third ground wiring GW3 overlap each other in plan view from the thickness direction of the board 30. Therefore, as illustrated in FIG. 12, it is possible to further transfer the heat of the heat generation element 21 to the housing 40 by using the third heat path R3.

Third Embodiment

An electronic control device according to a third embodiment will be described below with reference to FIGS. 13 and 14. In the following description, the same components as those of the first embodiment are denoted by the same reference signs, and differences will be mainly described. The points not specifically described are the same as those in the first embodiment. The present embodiment is different from the second embodiment mainly from a point of the boundary closer to the via 35 among the third boundary B3 and the fourth boundary B4.

Figure 13:
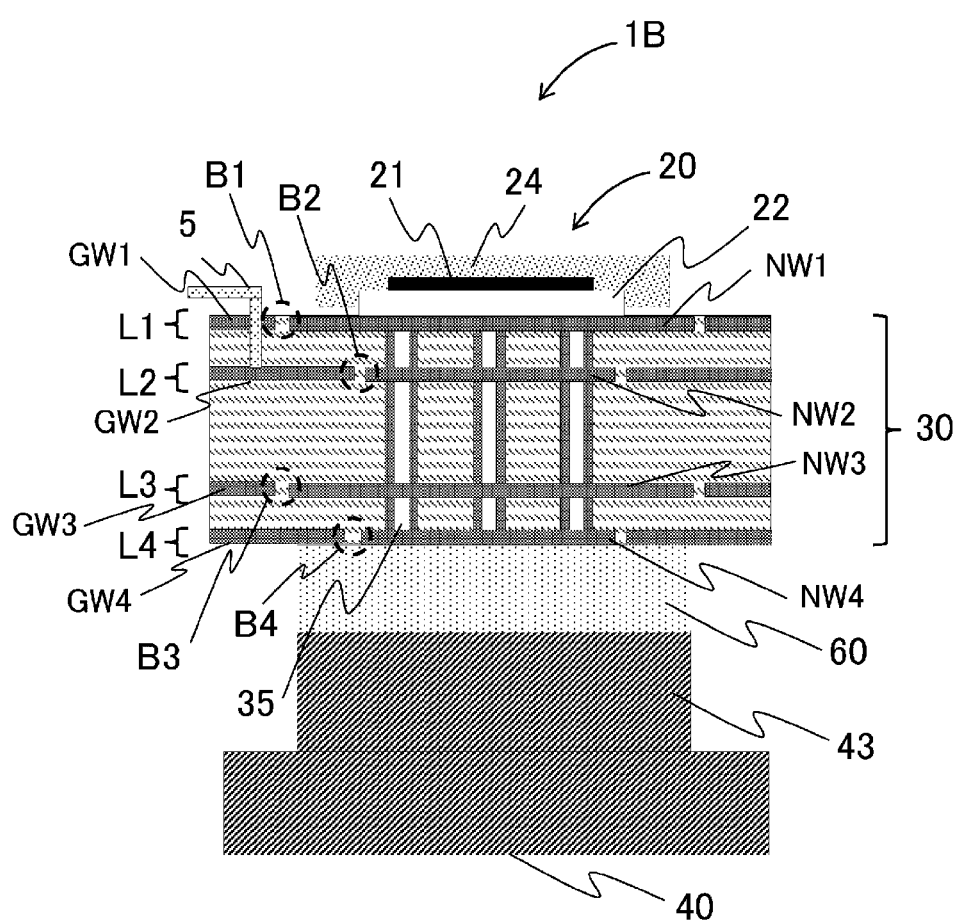
FIG. 13 is an enlarged cross-sectional view of a vicinity of an electronic component according to a third embodiment.

FIG. 13 is a cross-sectional view of the vicinity of the electronic component 20 in an electronic control device 1B according to the third embodiment. FIG. 13 corresponds to FIG. 3 in the first embodiment and FIG. 11 in the second embodiment. The electronic control device 1B is different from the electronic control device 1A in the second embodiment in that the third boundary B3 is located farther from the via 35 than the fourth boundary B4. The fourth non-ground wiring NW4 overlaps the third non-ground wiring NW3 in plan view from the thickness direction of the board 30. The second terminal 5A is in contact with not only the third ground wiring GW3 but also the fourth ground wiring GW4.

(Heat Dissipation Path)

Figure 14:
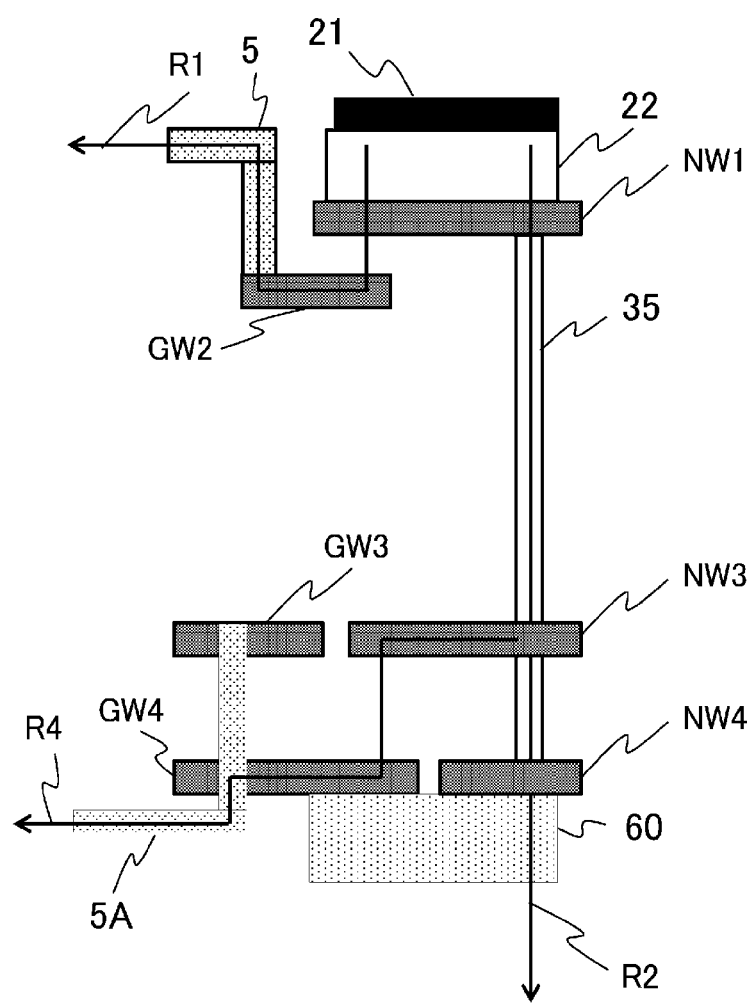
FIG. 14 is a conceptual diagram illustrating a heat dissipation path of an electronic control device in the third embodiment.

FIG. 14 is a conceptual diagram illustrating a heat dissipation path of the electronic control device 1B. FIG. 14 illustrates only portions necessary for describing the heat dissipation path in FIG. 13. The electronic control device 1B includes a fourth heat path R4 instead of the third heat path R3 in the second embodiment. The fourth heat path R3 is a path through which the heat transferred to the third non-ground wiring NW3 via the via 35 is moved to the fourth ground wiring GW4 via the core material of the board 30 and then transferred to the housing side surface 42 via the second terminal 5A.

According to the third embodiment described above, it is possible to obtain the following operational effects.

(6) The first layer L1 is provided on one surface of the board 30. The second layer L2 is a layer closest to the first layer L1 in the board. The board 30 includes the fourth layer L4 on the other surface of the board 30. The board 30 includes the third layer L3 which is an inner layer closest to the fourth layer L4. The third layer L3 includes the third non-ground wiring NW3 that is in direct contact with the via 35. The fourth layer L4 includes the fourth ground wiring GW4 that is not in direct contact with the via 35 but is in electrical and thermal contact with the housing 40. The third non-ground wiring NW3 and the fourth ground wiring GW4 overlap each other in plan view from the thickness direction of the board 30. Therefore, as illustrated in FIG. 14, it is possible to transfer the heat of the heat generation element 21 to the housing 40 by further using the fourth heat path R4.

The above-described embodiments and modification examples may be combined. Although various embodiments and modification examples have been described above, the present invention is not limited to these contents. Other forms considered within the scope of the technical idea of the present invention are also included in the scope of the present invention.

The disclosure of the following priority application is incorporated herein by reference.

Japanese Patent Application No. 2020-024134 (filed on Feb. 17, 2020)

REFERENCE SIGNS LIST 1, 1A, 1B electronic control device
20 electronic component
21 heat generation element
22 heat sink
30 board
35 via
40 housing
50 conductive material
60 insulating heat transfer portion
L1 first layer
L2 second layer
NW1 first non-ground wiring
GW2 second ground wiring

What is claimed is:

1. An electronic control device comprising:
a housing that dissipates heat of a heat generation element; and
a board that is in contact with the housing wherein the board includes
a heat sink on which the heat generation element is mounted,
a via that penetrates the board in a thickness direction, wherein the via is in thermal contact with the housing via an insulating heat transfer portion that is an insulator,
a first layer formed on a first surface of the board that includes a first non-ground wiring that is in direct contact with the heat sink, and
a second layer that is a layer closest to the first layer in the board, wherein the second layer includes a second ground wiring that is in electrical and thermal contact with the housing,
a fourth layer formed on a second surface of the board, wherein the fourth layer includes a fourth ground wiring that is not in direct contact with the via but is in electrical and thermal contact with the housing and
a third layer that is an inner layer closest to the fourth layer, wherein the third layer includes a third non-ground wiring that is in direct contact with the via;
wherein:
a potential of the housing is a ground,
a potential of the heat sink is a non-ground, the first non-ground wiring and the second ground wiring overlap each other in plan view from the thickness direction of the board, and the third non-ground wiring and the fourth ground wiring overlap each other in the plan view from the thickness direction of the board.

2. The electronic control device according to claim 1, wherein the housing is made of resin.

3. The electronic control device according to claim 1, wherein a ratio of an area in which the first non-ground wiring and the second ground wiring overlap each other in the plan view with respect to a distance between the first non-ground wiring and the second ground wiring in the thickness direction of the board is greater than 80 mm.

* * * * *